United States Patent [19]

Wong et al.

[11] Patent Number: 5,491,432
[45] Date of Patent: Feb. 13, 1996

[54] CMOS DIFFERENTIAL DRIVER CIRCUIT FOR HIGH OFFSET GROUND

[75] Inventors: Anthony Y. Wong, Saratoga; Eric Chan, Fremont; Brian Cheung; Daniel Wong, both of San Jose, all of Calif.

[73] Assignee: LSI Logic Corporation, Milpitas, Calif.

[21] Appl. No.: 927,097

[22] Filed: Aug. 7, 1992

[51] Int. Cl.[6] .................. H03K 19/0185; H03K 19/0948
[52] U.S. Cl. .................. 326/86; 326/33; 326/98; 326/81
[58] Field of Search .................. 307/443, 451, 307/475, 481, 296.2; 326/83, 86, 82, 21, 98, 33, 121, 81; 327/534

[56] References Cited

U.S. PATENT DOCUMENTS

| | | | |
|---|---|---|---|
| 4,885,479 | 12/1989 | Oritani | 307/443 |
| 4,950,920 | 8/1990 | Hara et al. | 307/443 |
| 5,041,738 | 8/1991 | Walters, Jr. | 307/451 |
| 5,075,571 | 12/1991 | Dhong et al. | 307/296.2 |
| 5,157,279 | 10/1992 | Lee | 307/296.2 |
| 5,194,764 | 3/1993 | Yano et al. | 307/481 |
| 5,206,544 | 4/1993 | Chen et al. | 307/451 |

Primary Examiner—David R. Hudspeth
Assistant Examiner—Jon Santamauro
Attorney, Agent, or Firm—Townsend and Townsend and Crew

[57] ABSTRACT

A CMOS driver circuit which differentially drives a pair of transmission lines at a first terminal in response to a signal on the CMOS driver circuit's input terminal for reception of said signal at a second terminal is provided. The driver circuit has two pairs of drive transistors. Each drive transistor has first and second source/drains and a gate. Each drive transistor pair is connected to one of said transmission line pair, and has a NMOS transistor and a PMOS transistor.

10 Claims, 3 Drawing Sheets

CMOS DIFFERENTIAL DRIVER CIRCUIT FOR HIGH OFFSET GROUND

BACKGROUND OF THE INVENTION

The present invention is related to electronic circuits which drive signals onto transmission lines and, more particularly, to CMOS circuits which drive differential digital signals onto transmission lines.

In the transmission of electrical signals, the signals are driven onto the transmission lines at one terminal for reception at a second, remote terminal. Differential signals are used in which signals are transmitted over a pair of lines. The difference in the voltages on the two lines represents the transmitted signal at the receiving terminal. Most electrical noise is not a problem since the interfering noise is cancelled out by the differential nature of the signals.

However, a recurring problem in electrical signal transmission is the possibility that the reference voltage, i.e., ground, may not be the same at the two terminals. This offset of ground may cause a latchup condition in the circuits at the terminal at the higher ground potential. To avoid this problem, digital signal driver circuits, such as NTL (NMOS Transceiver Logic) and GTL (Gunning Transceiver Logic), offset the range of switching voltages from ground.

Nonetheless, these digital signal driver circuits have a limited offset. If the difference in the ground reference exceeds 1 volt, latch-up conditions will still occur.

To avoid these problems the present invention provides for an effective, yet inexpensive, solution for driving digital differential signals using CMOS circuits, even though a high offset ground at one terminal of a transmission line.

SUMMARY OF THE INVENTION

The present invention provides for a CMOS driver circuit which differentially drives a pair of transmission lines at a first terminal in response to a signal on the CMOS driver circuit's input terminal for reception of said signal at a second terminal. The driver circuit has two pairs of drive transistors. Each drive transistor has first and second source/drains and a gate. Each drive transistor pair is connected to one of said transmission line pair, and has a NMOS transistor and a PMOS transistor.

The NMOS transistor has a first source/drain connected to a first voltage supply and a second source/drain connected to an output terminal, which is connected to one of the transmission lines. The PMOS transistor has a first source/drain connected to a second voltage supply, the second voltage supply is ground, and a second source/drain connected to the output terminal and the transmission line.

Digital logic connected to the input terminal and to gates of said drive transistors generate complementary signals for differential operation of the two pairs of drive transistors so that the NMOS transistor and the PMOS transistor of each drive transistor pair is alternatively switched off and on responsive to a signal on the input terminal. In this manner signals on each transmission line operate in a voltage range to compensate for an offset of the second voltage supply at the second terminal.

The digital logic in the CMOS driver circuit also has delay elements for synchronizing the switching of the drive transistors. Some of the delay elements are capacitors in the form of specially wired transistors. Other delay elements are extra transistors in inverters which are part of the digital logic. The extra transistors slow the switching of the inverters.

BRIEF DESCRIPTION OF THE DRAWINGS

A more detailed understanding of the present invention may be achieved by perusing the following Detailed Description Of Preferred Embodiments of the present invention with reference to the following drawings.

DETAILED DESCRIPTION OF PREFERRED EMBODIMENT(S)

Figure 1:
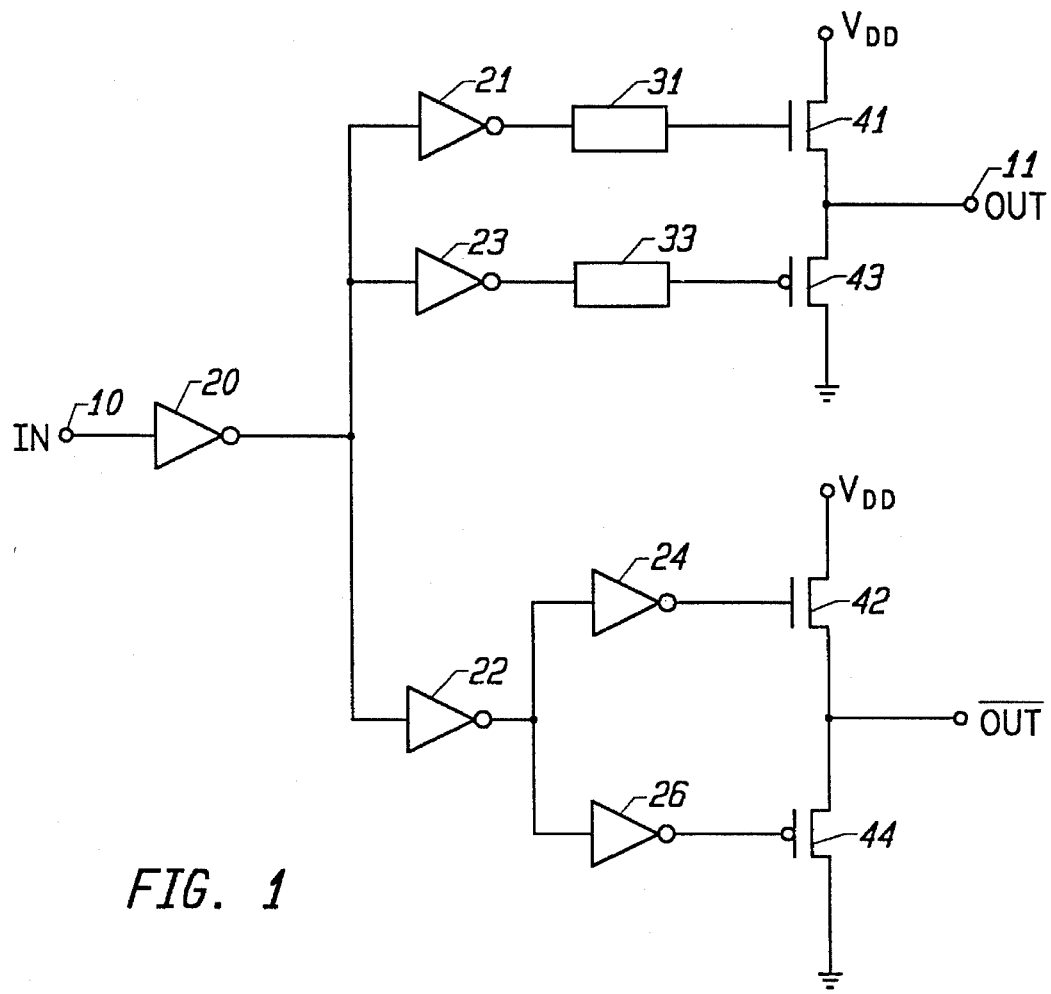
FIG. 1 is a block diagram of one embodiment of the present invention.

FIG. 1 is a circuit block diagram of a CMOS driver circuit according to the present invention. The driver circuit has an input terminal 10 which receives a digital signal. Logic elements formed by inverters and delay elements generate signals for the gate terminals of four driver transistors 41–44. Complementary pairs of these transistors are connected to output terminals 11 and 12 which are connected to two transmission lines which carry the differential digital signals. The logic elements operate so that the logic state of the signals on the output terminals 11, 12 are complementary to each other.

The input terminal 10 is connected to the input terminal of a first inverter 20. The output terminal of the inverter 20 is connected to the input terminals of inverters 21, 23, and 22. The two inverters 21, 23 drive the true logic signals appearing on the terminal 10 to the gate electrodes of the NMOS driver transistor 41 and PMOS driver transistor 43, respectively. Delay elements 31 and 33 slow the signal from the output terminals of the inverters 21 and 23 to the gates of the transistors 41 and 43, respectively.

The output terminal of the inverter 20 is also connected to the input terminal of the inverter 22 which has its output terminal connected to the input terminals of inverters 24 and 26. The inverters 24 and 26 are respectively connected to the gate terminals of the NMOS driver transistor 42 and the PMOS driver transistor 44. Since the digital signal at the input terminal 10 travels through three inverters, the logic state of the signals on the gates of the driver transistors 42 and 44 are inverted.

Each of the pairs of complementary transistors which drive the output terminals 11 and 12 form an inverter. However, unlike most CMOS inverter circuits, the present invention has the NMOS transistor of each pair, the transistor 41 and 42, connected to the positive power supply and the PMOS transistor of each pair, the transistor 43 and 44, connected to ground. Thus, each NMOS transistor 41 and 42 has its drain connected to $V_{DD}$ and its source connected to the output terminal 11 or 12. The terminal 11 or 12 is also connected to the source of the PMOS transistors 43 and 44, respectively, which, in turn, has its drain connected to ground.

As contemplated by the present invention, the logic elements described above and the driver transistors are part of an integrated circuit. In integrated circuits having NMOS and PMOS transistors, the NMOS transistors are typically located in a P-doped region of the semiconductor substrate held at the lowest voltage, in this case, ground. Similarly, the PMOS transistors are located in an N-doped region of the substrate which is held at the highest voltage, in this case, $V_{DD}$ at +5 volts.

Thus, the channel regions of each of the transistors 41–44 are strongly back-biased. This strong back-bias increases the threshold voltage of the driver transistors 41–44. The result is that the source voltage of the NMOS transistors 41, 42 is decreased by $V_{DD}-V_T$, when turned on and the source voltage of PMOS transistors 43, 44 is increased by ground $+V_T$ when turned on. Thus, the voltage swing on the output terminals 11 and 12 do not swing as widely as in the case of a "standard" inverter in which the PMOS transistor is connected to the positive voltage supply and the NMOS transistor is connected to ground.

Figure 4:
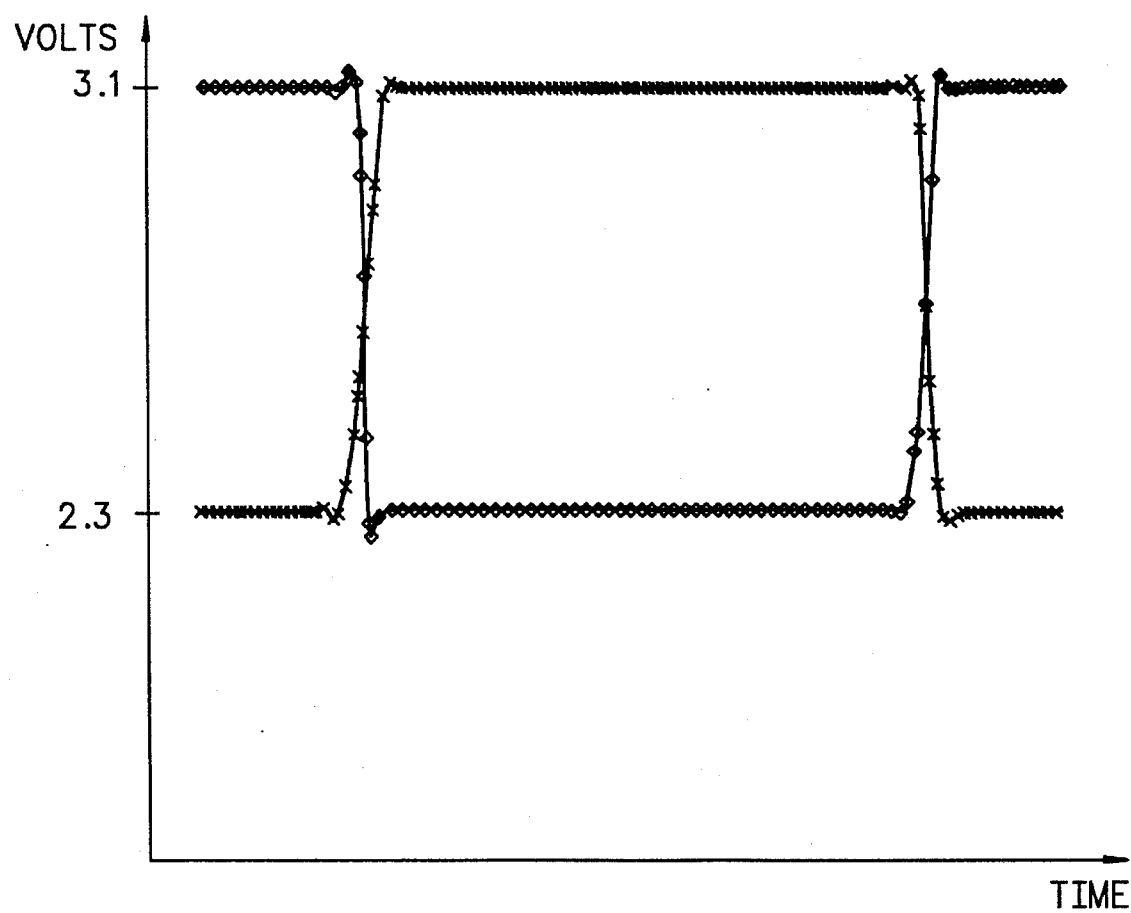
FIG. 4 illustrates an output signal of the CMOS driver circuit of FIG. 1.

FIG. 4 shows the resulting voltage swing at each of the terminals 11 and 12 for the driver circuit shown in FIG. 1. The voltage swing is between +2 to +volts at each of the output terminals. Thus, the digital signals are driven on the transmission lines in a voltage range far above ground.

To reduce the skew between the transmission of the incoming signal at terminal 10 and the generation of the differential signal on the output terminals 11 and 12, the present invention provides for delay elements 31 and 33. As shown in FIG. 1, the signal from the input terminal 10 which appears on the output terminal 12, travels through one more inverter than does the signal from the terminal 10 which appears on the output terminal 11. Delay elements 31 and 33 insure that the signal on the shorter path is delayed so that the driver transistors 41 and 43 operate more or less simultaneously with the transistors 42 and 44.

Figure 2:
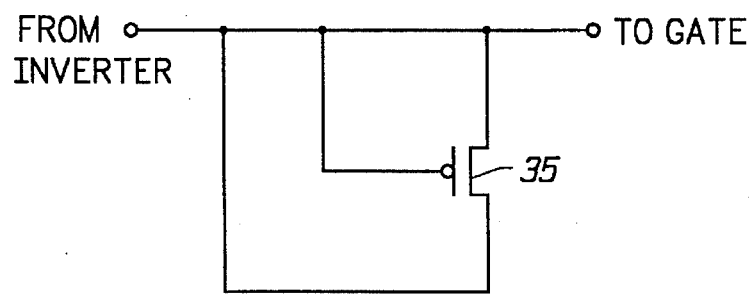
FIG. 2 is a circuit diagram of a delay element in FIG. 1.

FIG. 2 is an exemplary circuit illustrating the construction of each of the delay elements 31 and 33. The delay elements 31 and 33 respectively add a capacitance between the output terminals of the inverters 21 and 23 and the gates of the transistors 41 and 43. The capacitance is added by adding a transistor structure shown as PMOS transistor 35. All of the terminals, i.e., the source/drains and the gate, of the transistor are connected to the output terminal of the inverter 21 and 23. With the proper sizing of the added transistor, the delay elements 31 and 33 sufficiently slow the output signals from the inverters 21, 23 to match the signals appearing on the gates of the transistors 42 and 44.

Figure 3A:
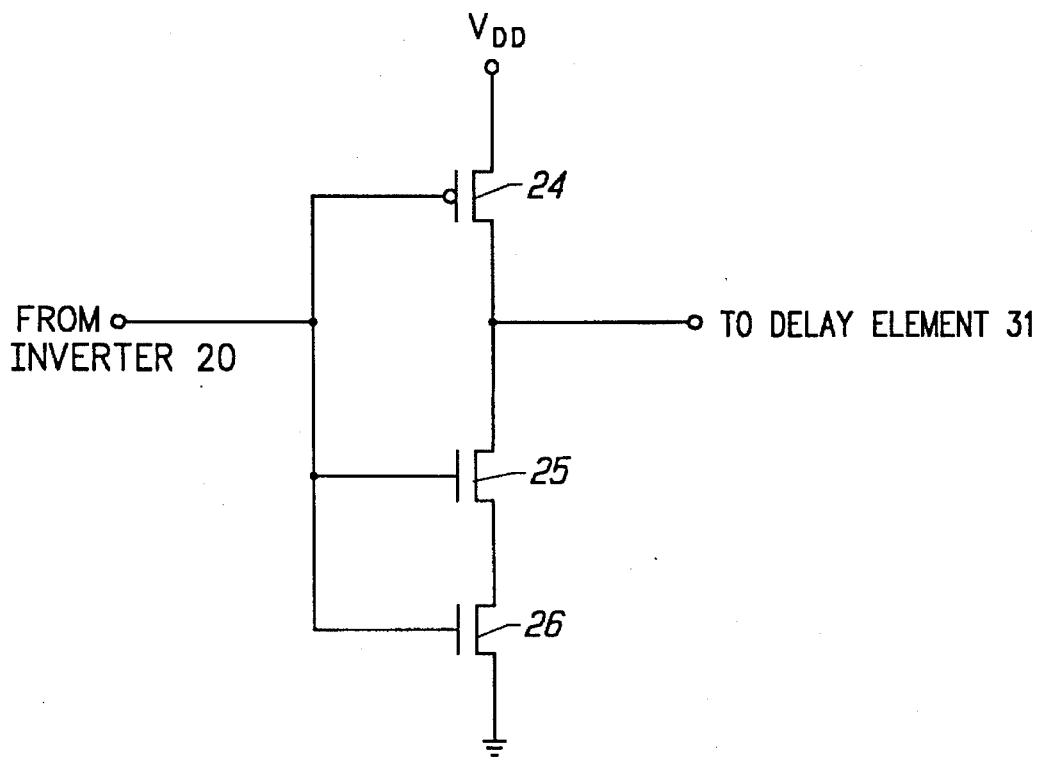
FIG. 3A is a circuit digram of one of the inverters in FIG. 1.

The inverters 21 and 23 are also modified somewhat to better reduce the skewing of the output signals on the terminals 11 and 12. The inverter 21 is shown in FIG. 3a. Besides the complementary pair of transistors, PMOS transistor 24 connected to $V_{DD}$ and NMOS transistor 25, the inverter 21 has an additional NMOS transistor 26 which connects the source of the NMOS transistor 25 to ground. The gate of the NMOS transistor 26 is connected together with the gates of the transistors 24 and 25. When a logic high signal appears at the input terminal of the inverter 21, both NMOS transistors 25 and 26 are turned on. With the existence of the transistor 26, the gate of the NMOS transistor 41 takes longer to be pulled down due to the added resistance. Thus, the transistor is slowed in turning off.

Figure 3B:
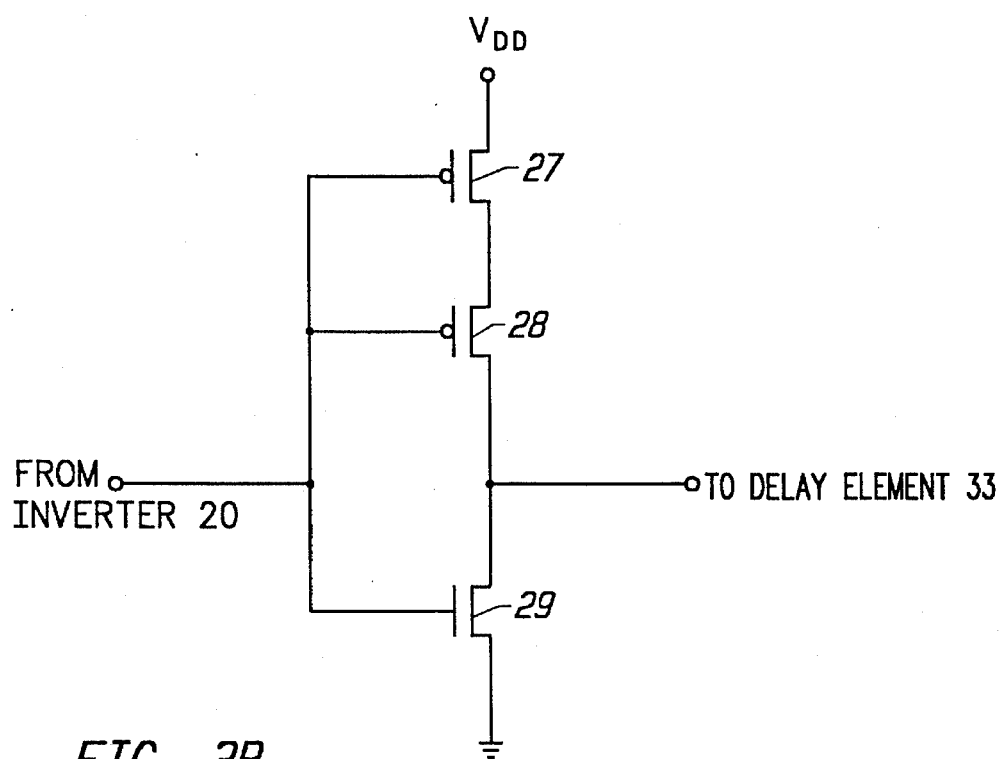
FIG. 3B is a circuit diagram of another inverter in FIG. 1.

Likewise, as shown in FIG. 3b, the inverter 43 has a PMOS transistor 27 which is connected in series with the complementary transistor pair 28 and 29. When the PMOS transistor 27 has its terminal connected together with the gates of the PMOS transistor 28 and NMOS transistor 29. With the added resistance of the transistor 27, the gate of the PMOS transistor 43 is more slowly pulled up toward $V_{DD}$. Thus, the PMOS transistor 43 is also slowed in turning off.

In this manner, the present invention synchronizes the operating speeds of the two output terminals 11 and 12 to avoid skewing.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the metes and bounds of the appended claims.

What is claimed is:

1. A CMOS driver circuit for differentially driving a pair of transmission lines at a first terminal in response to a signal on an input terminal for reception of said signal at a second terminal, said driver circuit comprising two pairs of drive transistors, each drive transistor having first and second source/drains and a gate, each drive transistor pair connected to one of said transmission line pair and having
a NMOS drive transistor having a drain connected to a first voltage supply, a source connected to an output terminal connected to said one transmission line,
a PMOS drive transistor having a drain connected to a second voltage supply, said second voltage supply at a lower voltage than said first voltage supply, and a source connected to said output terminal and said one transmission line; and digital logic means connected to said input terminal and to gates of said drive transistors, said digital logic means generating complementary signals for differential operation of said two pairs of drive transistors so that said NMOS transistor or said PMOS transistor of each driver transistor pair is alternatively turned on responsive to a signal on said input terminal, and including means for synchronizing said complementary signals on gates of said driver transistors;

whereby signals on each transmission line operate in a narrowed voltage range with respect to said first and second voltage supplies for immunity from an offset in level of one of said voltage supplies at said second terminal.

2. The CMOS driver circuit as in claim 1 wherein said digital logic means comprises a plurality of paths connecting each gate of said drive transistors to said input terminal, each path having a plurality of serially-connected inverters.

3. The CMOS driver circuit as in claim 2 wherein said synchronizing means comprises a delay element in each one of said plurality of paths having a smaller number of serially-connected inverters than another path, whereby the total number of inverters and delay element in said one path is equal to the total number of inverters in said another path.

4. The CMOS driver circuit as in claim 3 wherein said delay element comprises a capacitive element.

5. The CMOS driver circuit as in claim 4 wherein said synchronizing means further comprises means in at least one inverter having an output node connected to a gate of one of said drive transistors for slowing the current flow through said output node whereby the switching of said one drive transistor is slowed.

6. The CMOS driver circuit as in claim 5 wherein said at least one inverter comprises an input node and a pair of complementary transistors, each transistor having a source and a drain and a gate, said transistors connected between said first and second voltage supplies by said sources and drains, and wherein said current slowing means comprises a third transistor having a source and drain and a gate, said third transistor connected serially to said complementary transistor pair between said first and second voltage supplies, said gates of said three transistors connected to said input node.

7. A CMOS driver circuit for differentially driving a pair of transmission lines at a first terminal in response to a signal on an input terminal for reception of said signal at a second terminal, said driver circuit comprising two pairs of drive transistors, each drive transistor having first and second source/drains and a gate, each drive transistor pair connected to one of said transmission line pair and having
- a NMOS drive transistor having a drain connected to a first voltage supply, a source connected to an output terminal connected to said one transmission line,
- a PMOS drive transistor having a drain connected to a ground voltage supply, said ground voltage supply at a lower voltage than said first voltage supply, and a source connected to said output terminal and said one transmission line; and digital logic means connected to said input terminal and to each gate of said drive transistors by a plurality of paths, each path having a plurality of serially-connected inverters, said digital logic means generating complementary signals for differential operation of said two pairs of drive transistors so that said NMOS transistor or said PMOS transistor of each driver transistor pair is alternatively turned on responsive to a signal on said input terminal, and including a delay element in each one of said plurality of paths having a smaller number of serially-connected inverters than another path, so that the total number of inverters and delay element in said one path is equal to the total number of inverters in said another path to synchronize said complementary signals on gates of said driver transistors;

whereby signals on each transmission line operate in a narrowed voltage range with respect to said first and second voltage supplies for immunity from an offset in level of one of said voltage supplies at said second terminal.

8. The CMOS driver circuit as in claim 7 wherein said delay element comprises a capacitive element.

9. The CMOS driver circuit as in claim 7 wherein said synchronizing means further comprises means in at least one inverter having an output node connected to a gate of one of said drive transistors for slowing the current flow through said output node whereby the switching of said one drive transistor is slowed.

10. The CMOS driver circuit as in claim 5 wherein said at least one inverter comprises an input node and a pair of complementary transistors, each transistor having a source and drain and a gate, said transistors connected between said first and second voltage supplies by said sources and drains, and wherein said current slowing means comprises a third transistor having a source and drain and a gate, said third transistor connected serially to said complementary transistor pair between said first and second voltage supplies, said gates of said three transistors connected to said input node.

* * * * *